US007054133B2

(12) United States Patent
Orth

(10) Patent No.: US 7,054,133 B2
(45) Date of Patent: May 30, 2006

(54) ELECTRONIC TEXTILE TOUCH LIGHT CONTROLLER

(76) Inventor: Margaret Orth, 1205 East Pike St., Seattle, WA (US) 98122

( * ) Notice: Subject to any disclaimer, the term of this patent is extended or adjusted under 35 U.S.C. 154(b) by 0 days.

(21) Appl. No.: 11/087,031

(22) Filed: Mar. 21, 2005

(65) Prior Publication Data

US 2005/0207172 A1 Sep. 22, 2005

Related U.S. Application Data

(60) Provisional application No. 60/559,882, filed on Apr. 7, 2004, provisional application No. 60/554,712, filed on Mar. 22, 2004.

(51) Int. Cl.
*H01G 5/01* (2006.01)

(52) U.S. Cl. ...................... 361/278; 361/280; 361/288; 362/276; 362/395

(58) Field of Classification Search ................ 361/277, 361/278, 280, 283.3, 288; 206/418, 320, 206/780; 362/101, 276, 295, 802, 806, 352
See application file for complete search history.

(56) References Cited

U.S. PATENT DOCUMENTS 2,632,098 A 3/1953 Marchese
2,810,066 A 10/1957 Green
3,702,928 A * 11/1972 Alger .......................... 362/33
4,668,877 A 5/1987 Kunen
4,723,080 A 2/1988 Cline et al.
4,751,625 A 6/1988 Lin
4,816,698 A 3/1989 Hook
4,874,991 A 10/1989 Ruskin
4,926,062 A 5/1990 Ussery et al.
5,010,460 A 4/1991 Lin
2002/0125163 A1* 9/2002 Chou ......................... 206/418
2002/0159267 A1 10/2002 Hao
2005/0072057 A1* 4/2005 Ciaccia .......................... 52/40

FOREIGN PATENT DOCUMENTS

GB 2249378 A 9/1990

* cited by examiner

*Primary Examiner*—Anthony Dinkins
(74) *Attorney, Agent, or Firm*—Polly L. Oliver

(57) ABSTRACT

A capacitive light/dimmer switch which uses soft or fuzzy fabrics made with electronic textiles instead of, or as an extension of, metal or plastic plates. The soft fabric material, which may be in the form of a pompom, tassel, fur, or other electronic trim element, provides an attractive and compelling user interface that is soft to the touch. The user simply touches the pompom, as he would the dimmer plate, to cause the amount of light to increase or decrease. The electronic textiles of the light controller comprise electrodes integrated into their yarns or fibers, resulting in a conductive material (electronic textile) that may be used as the user interface. This conductive material is electrically connected to a sensing circuit by either AC coupling or DC contact. When the user touches the conductive material, the sensing circuit measures the change in load of the electrodes, and the lighting is changed.

20 Claims, 7 Drawing Sheets

12
16
18
20
22a
22b
22
14
24
30
28

ELECTRONIC TEXTILE TOUCH LIGHT CONTROLLER

RELATED APPLICATION

This application claims priority from the U.S. Provisional Patent Application No. 60/554,712 filed Mar. 22, 2004, and also from U.S. Provisional Patent Application No. 60/559,882 filed Apr. 7, 2004.

FIELD OF THE INVENTION

This invention pertains generally to light dimmer switches and more particularly to a capacitive light controller fabricated from electronic textiles or electronic textile materials.

BACKGROUND OF THE FIELD

Known in the art are capacitive light/dimmer switches which use metal or plastic plates. These prior art switches use metal sheets as the conductive electrode that the user touches. An electronic circuit senses the voltage change when the user touches the metal sheet and the lighting is changed.

SUMMARY

The present invention provides a capacitive light/dimmer switch which uses soft or fuzzy fabrics made with electronic textiles instead of, or as an extension of, metal or plastic plates. The soft fabric material, which may be in the form of a pompom, tassel, fur, or other electronic trim element, provides an attractive and compelling user interface that is soft to the touch. The user simply touches the pompom, as he would the dimmer plate, to cause the amount of light to increase or decrease.

DETAILED DESCRIPTION

Figure 1:
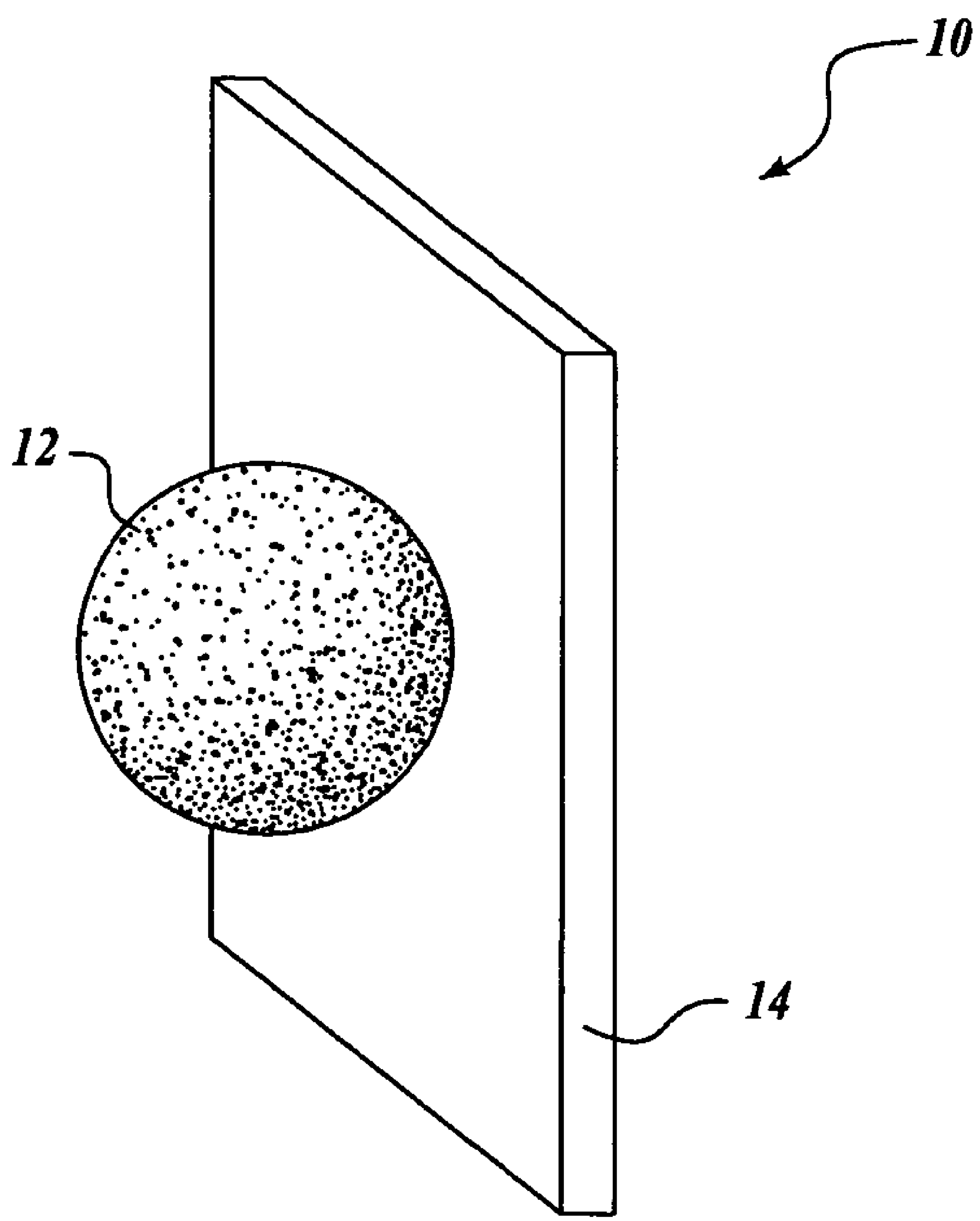
FIG. 1 is a perspective view of an electronic textile touch light controller.

FIG. 1 shows that the electronic textile touch light controller 10 may comprise an electronic trim element 12, such as a conductive pompom, fur, tufting, braid, tassel, bead, embroidery, fabric, printed ink, or other trim element made from electronic textiles—where the electronic trim element 12 is the user interface (i.e., will be touched by the user's body part, typically hand or fingers) and provides a conductive textile electrode. The electronic textiles so mentioned can be fabricated in a variety of form factors and with different textile processes, including but not limited to weaving, tufting, sewing, braiding, embroidery, felting, gluing, knitting, or printing.

A conductive pompom, fur, tufting, or tassels may be manufactured from composite stainless steel yarns, metal coated nylon, or any other soft conductive yarns that provide the desired impedance. Conductive pompoms are generally spherical balls made from multiple yarns, typically from the above-listed materials, tied together with a conductive attachment. (Alternatively, the ball can be coated with a conductive material after assembly.) Conductive braids can be made from tinsel wire, a variety of stainless steel yarns or fibers, metalized nylon or Kevlar™, or many other types of conductive yarns, including EMI (electromagnetic interference) shielding textile materials. Conductive beads can be sewn on to other electronic or non-electronic textiles. Conductive embroidery may be made with a combination of a soft, high impedance conductive yarn (in the top or needle) and a low impedance polyester stainless steel yarn to create a two-sided conductive fabric. This or other conductive fabric may be woven, tufted, or knitted with conductive yarns and/or coated with conductive material. Alternately, a conductive fabric may comprise a non-conductive fabric layer being laid adjacent to a conductive fabric layer and penetrated by conductive tufts, resulting in a sensor shag, conductive tufts, or fur material. A soft, conductive electrode may also be created by conductive printed ink being printed on, or metal coating otherwise deposited on, a conductive or non-conductive fabric or other textile element, such as fur or a pompom.

The trim element 12 is linked to the cover plate 14, which may be in the form of a wall plate (as shown here), lamp base, lighting control panel, toy exterior, or other appropriate object that at least partially houses a sensing circuit for sensing the capacitive load and change therein on a capacitive load plate. Many existing light switch or dimmer switch wall plates are of the snap-on type, and so that type will be here in illustrated. The cover plate 14 may be covered with a decorative wrap (as also shown in the exploded detail view of FIG. 2) or other aesthetic covering to be presented to the user's view—for instance, as the wall switch plate in a decorated room.

Figure 2:
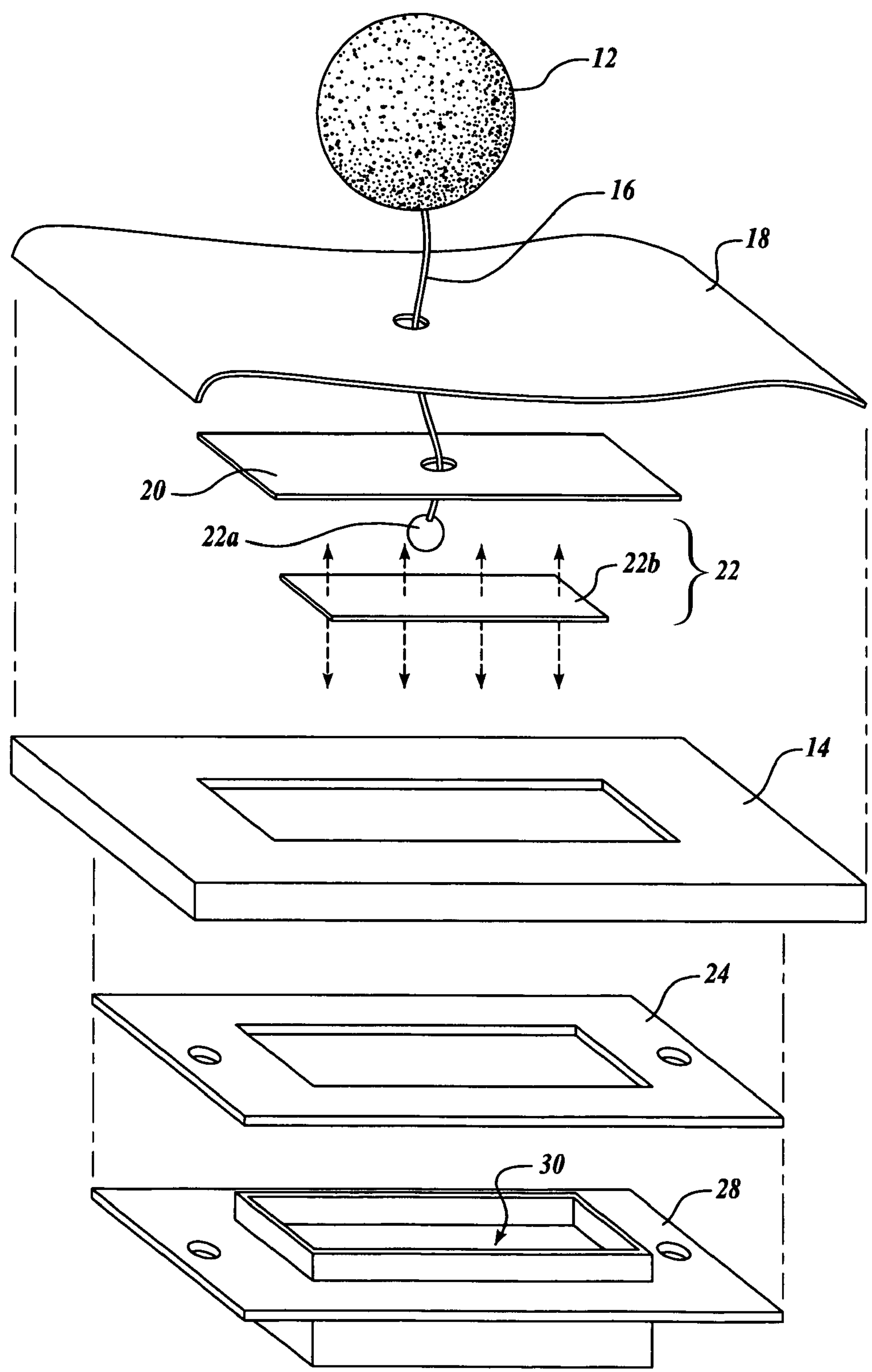
FIG. 2 is an exploded detail view of the electronic textile touch light controller of FIG. 1.

FIG. 2 shows how the trim element 12 may be linked to a metal capacitive load plate 30. Because the embodiment shown uses a decorative wrap around the wall plate, the trim element 12 is connected by a contact element 16 through the decorative wrap 18 and the optional foam padding 20 to the conductive element 22 for contacting the dimmer load plate 30. The contact element 16 is used to maintain the electric circuit of the electronic textile touch light controller 10 by electrically connecting the trim element 12 to the underside of the decorative wrap 18 (the conductive element 22) and may be a conductive yarn or other fiber, conductive adhesive or tape, metal wire, staple, or other fastener, or any other appropriate element. Obviously, if the decorative wrap 18 is not used, the contact element 16 and the conductive element 22 may be eliminated and the trim element 12 will directly contact the dimmer load plate 30. Likewise, the separate elements 16 and 22 may be eliminated and integrated in to a single trim element 12 that is woven or sewn onto the decorative wrap 18 in contact with the dimmer load plate 30, which may or may not be painted.

Electronic textiles provide a truly unique visual look for lighting controllers and lamps. Lamps and light switches with pompoms and other soft and/or fuzzy electronic textile controllers can be soft to touch and look very different than existing lighting elements. Squeezing a pompom or other soft textile item to control lights and other electronic devices, including toys, is surprisingly compelling.

The soft materials may also be more suitable in a child's bedroom where hard or sharp objects are undesirable. The use of a pompom allows the creation of a capacitive switch that is not flat. Thus it may easily be found by "feel" because it protrudes from the wall, even in the dark. But because the switch material is soft, it is more pleasant for the hand to interact with, as well as safer.

Still referring to FIG. 2, whether the decorative wrap 18 is used, or whether the elements 16 and 18 are eliminated and integrated into the trim element 12, the conductive element 22 must be in physical contact with the dimmer load plate 30 and may be any conductive fabric, yarn, or fiber, double-sided conductive tape, a metal fastener or ring, or any appropriate conductive element. In the embodiment shown, the conductive element 22 comprises a metal knot 22*a* at the end of the contact element 16 adjacent to a section of double-sided conductive tape 22*b*, which is in physical contact with the dimmer load plate 30. Although its use as a conductive element is not required by the electronic textile touch light controller 10, the double-sided tape 22*b* is used because it provides a large, conductive area for capacitive coupling. The linkage as illustrated (tape adhesive) assures continuous proximity between the trim element 12 and the load plate 30. The tape is not necessary if the contact element remains in contact with the load plate due to pressure from the cover or another mechanical mechanism.

Referring still to FIG. 2, the exploded detail view is completed with the decorative wrap 18 being wrapped around the snap-on wall plate 14. Such snap-on wall plates typically make use of an adjacent plastic fitting 24 before they mount onto and/or around the load plate 30 held within the electrical box 28. As already mentioned, the wall plate 14 at least partially houses a sensing circuit for sensing the capacitive load and change therein on a capacitive load plate. The electrical box 28 may also partially house such sensing circuit. There are various types of circuits that can measure the capacitive load on a metal electrode (load plate) and/or the conductive textile electrode itself. When the user touches the conductive material, the sensing circuit measures the change in load or capacitance of the electrodes, and the lighting is changed, or an electrical control signal is sent. The sensing circuit may make use of several different methods, including either AC coupling or DC contact explained below.

In a first AC (alternating current) coupling method, the textile electrode or load plate may be connected to the AC voltage source through a "current sense" resistor. When the electrode is touched by a human body part, the electrode will be "loaded," i.e., its capacitance will increase, resulting in a decrease in the impedance of the path out from the voltage source. This decrease in impedance results in additional current flowing out of the AC source through the current sense resistor. The current flow is manifest as a voltage drop across the current sense resistor. The voltage drop across this resistor may be measured by various methods known to those skilled in the art.

In a second DC (direct current) contact method, the textile electrode or load plate is directly connected to a pin of a microprocessor. Microprocessor timing measurements can then be used to sense the change in load on the textile electrode or load plate. More specifically, the microprocessor may charge said pin to a standard TTL (transistor-transistor logic) level, enter a high impedance state, and then measure the time that it takes the pin to discharge through a resistor to ground and return to a lower TTL level. In an alternative implementation, one microprocessor pin is used for charging, and a different pin is used for sensing. The sensing pin is always in the high impedance ("input") state. The driving pin toggles between output mode and high impedance ("input") mode. The input sensing pin can be connected directly to the output pin (similar to the first implementation), or to a different point in the circuit (similarly to the junction between the "current sense" resistor and the capacitor in the first AC coupling method).

In yet another embodiment, a resistor may be placed between the output microprocessor pin and the sensing junction. In this embodiment, a separate sense/actuation pin is also used. The sense pin is momentarily configured as an output, and the sense and drive pins are brought to the TTL high state. This causes the sense electrode to be charged to the TTL high voltage level. Then the sense pin is changed to a high impedance input, and the drive pin is set to the TTL low state. The time to discharge is measured. Next the sense pin is configured to an output in the TTL low state. Then the sense pin is returned to the input configuration, the drive pin is set to the TTL high state, and the time to charge is measured.

Figure 3:
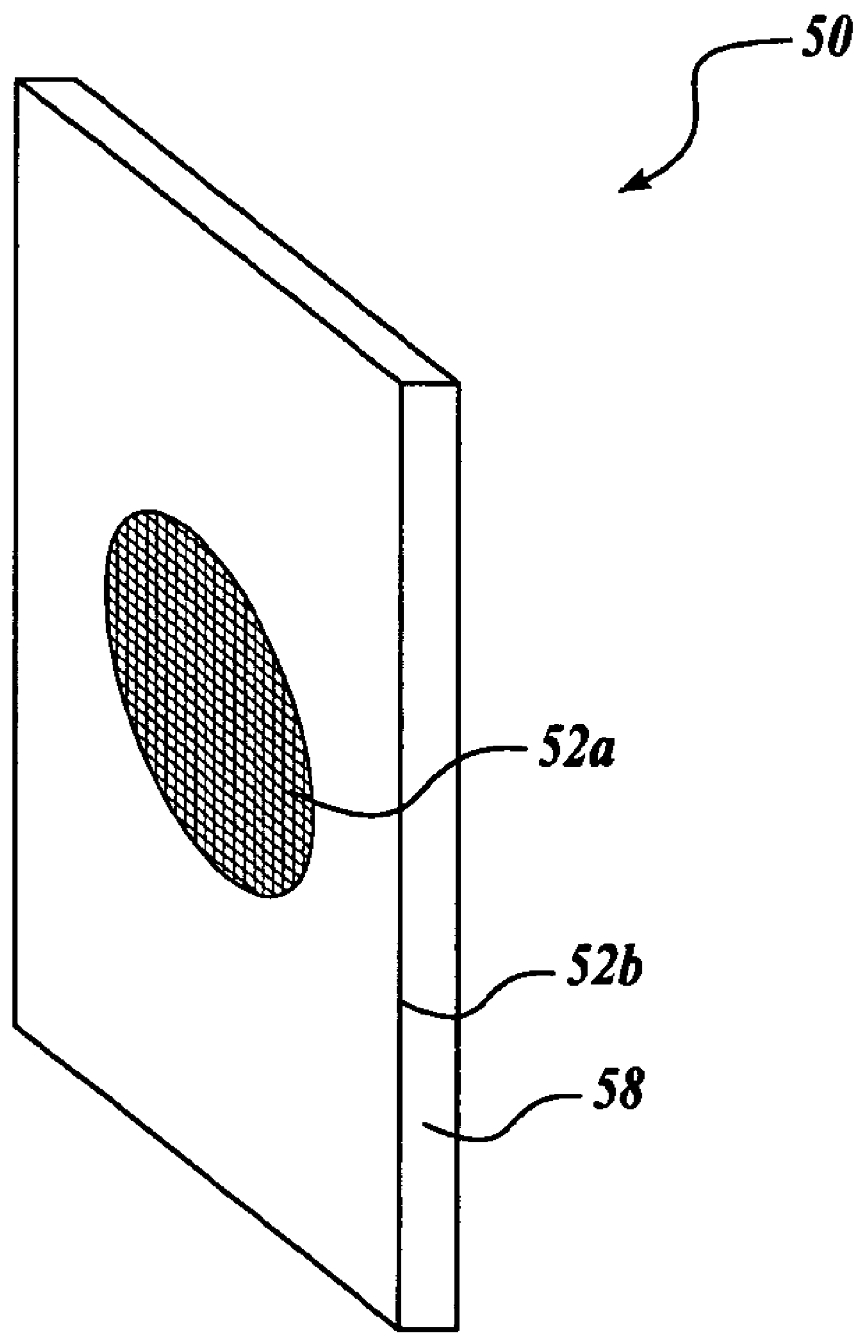
FIG. 3 is a perspective view of an alternate embodiment of an electronic textile touch light controller.

FIG. 3 shows an alternate embodiment of the electronic textile touch light controller. This alternate embodiment 50 comprises a trim element 52 including a woven, embroidered, or tufted design 52*a* integrated directly with a fabric cover providing a decorative wrap 52*b* for wrapping or otherwise covering the wall plate 58. As seen in the following FIG. 4, the integrated trim element 52 eliminates the need for a contact element, such as element 16, because conductive textile materials penetrate from front to back of the decorative textile wrap and provide both a textile electrode for the hand to contact and a way for the electrode to be adjacent to the load plate. Thusly, in this embodiment, the means for linking may be a conductive element mounted directly between the decorative wrap and the load plate. The electronic textile touch light controller 50 further comprises optional foam padding 54, and optional double-sided conductive fabric tape 56 connected to the load plate 60. As previously mentioned, the electrical proximity between the trim element and the load plate must be maintained; therefore the double-sided tape 56 is used to insure such contact. Other mechanical means could also be employed. Neither the foam padding 54 nor the double-sided tape 56 is otherwise requisite to the invention.

Figure 4:
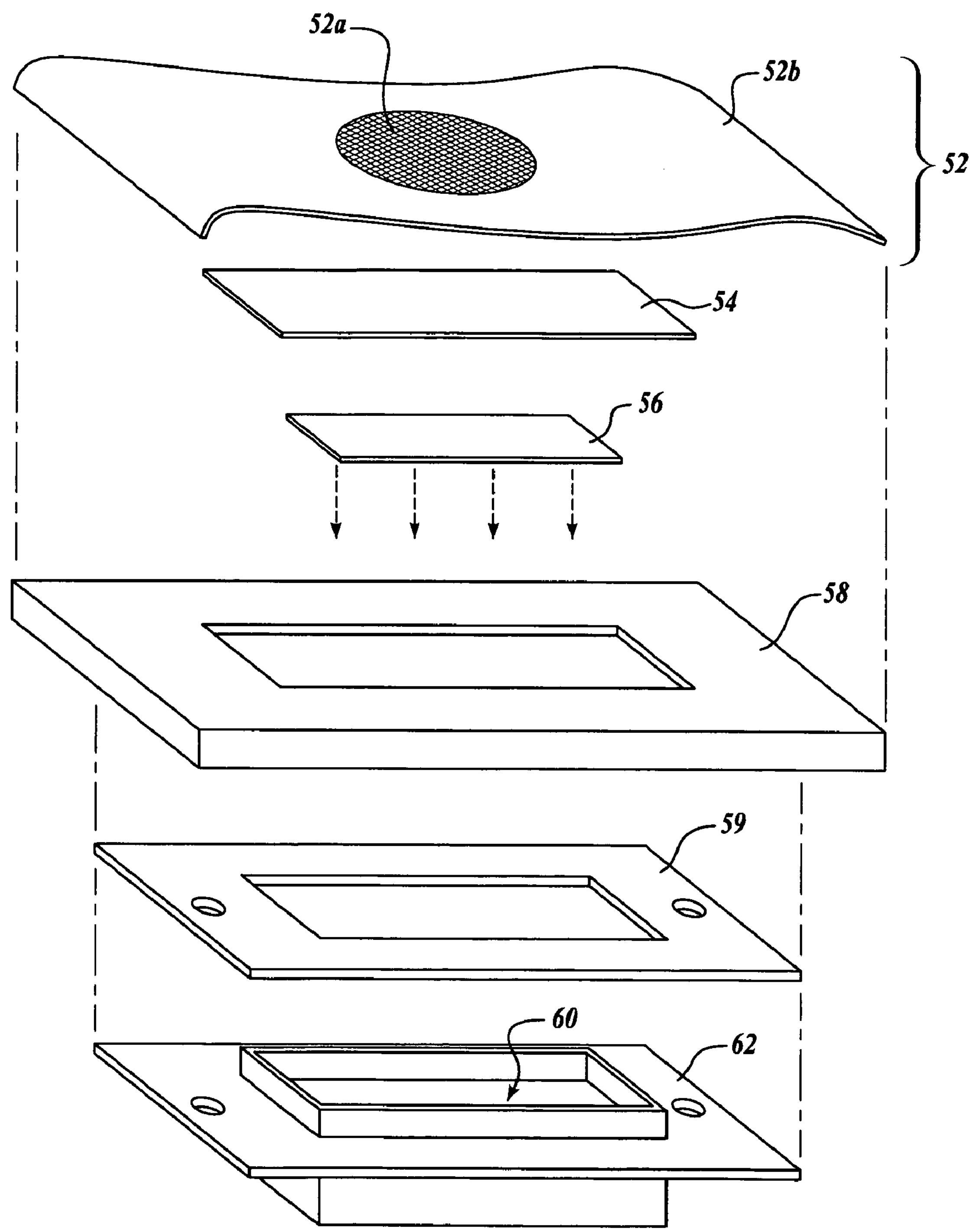
FIG. 4 is an exploded detail view of the electronic textile touch light controller of FIG. 3.

Referring still to FIG. 4, the exploded detail view is completed with the trim element 52 being wrapped around the snap-on wall plate 58. Such snap-on wall plates typically make use of an adjacent plastic fitting 59 before they mount onto and/or around the load plate 60 held within the electrical box 62. Obviously, the snap-on type of wall plate is not an important part of the invention, and the electronic textile touch light controller may be used with any other type of wall plate with or without the plastic fitting.

In further alternate embodiments, the load plate as such may be eliminated in favor of the textile trim element being directly connected to the sensing circuit, as an extension of, or alternate to, the load plate. For instance, a conductive yarn or other contact element of the trim element may be directly tied to a pin or other circuit element. (In a commercial dimmer switch, this circuit element is typically located behind the load plate.) The contact element may be a conductive textile itself: yarn (comprising stainless steel fibers, stainless steel composites, coated nylon fibers, coated fiberglass or other conductive yarns), fabric, braid, etc., or it may be a metal element, such as a wire. Likewise, the means for connecting the trim element to the circuit may be conductive yarn, wire, adhesive, tape, or other conductive fastener. In this manner, the design possibilities are greatly increased. The sensing may be accomplished using one of the two methods (AC coupling or DC contact) above discussed or any other suitable method, and the electrical device so controlled may be a lamp, light switch, dimmer switch, toy, or other consumer electronic product.

Figure 5:
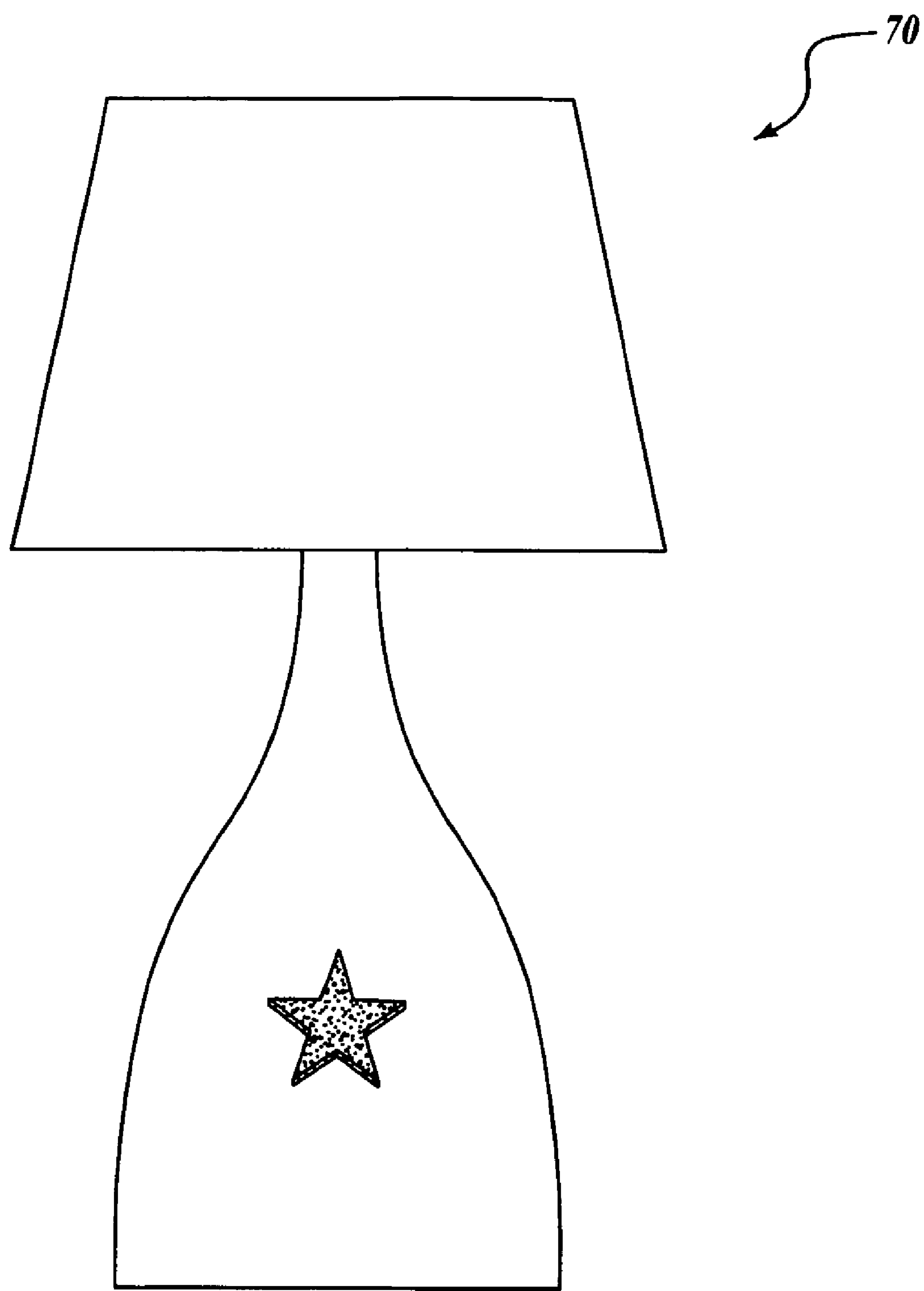
FIG. 5 is a perspective view of an alternate embodiment of an electronic textile touch light controller.
Figure 6:
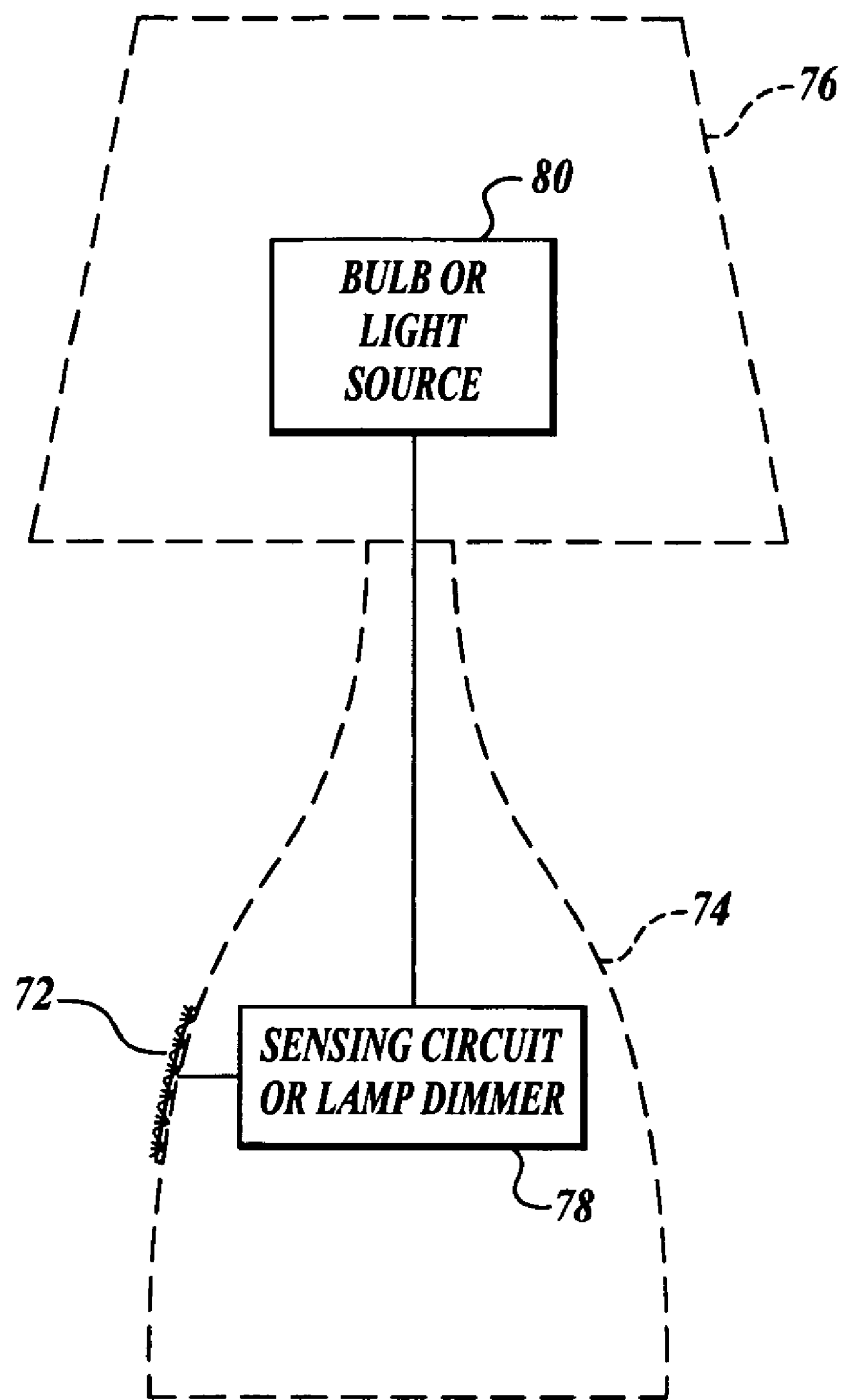
FIG. 6 is an exploded detail view of the electronic textile touch light controller of FIG. 5.

FIG. 5 shows yet another embodiment of the electronic textile touch light controller—a lamp 70. In this illustration, the electronic textile touch light controller may be in the form of a tufted star 72 and may be positioned on the lamp base 74. (Alternatively, the electronic textile touch light controller could be positioned on the lamp shade 76.) In this embodiment, the lamp base 74, which is typically made of ceramic, but could be wood, plastic, or some other suitable material, can be seen as replacing the cover plate 14 or 58 of the previous figures in the overall scheme of the invention. The remaining necessary elements will be similar to the previous embodiments, and one possible arrangement is shown in block diagram in FIG. 6, where the sensing circuit or lamp dimmer 78 is housed within the lamp base 74 and is linked to the tufted star 72. The sensing circuit or lamp dimmer 78 controls and is further linked to the bulb or other light source 80 typically positioned under the lamp shade 76. When a user (not shown) interfaces with the electronic textile touch light controller (e.g., the conductive material of the tufted star 72), the sensing circuit 78 measures the change in load of the electrodes, and the lighting is changed.

Figure 7:
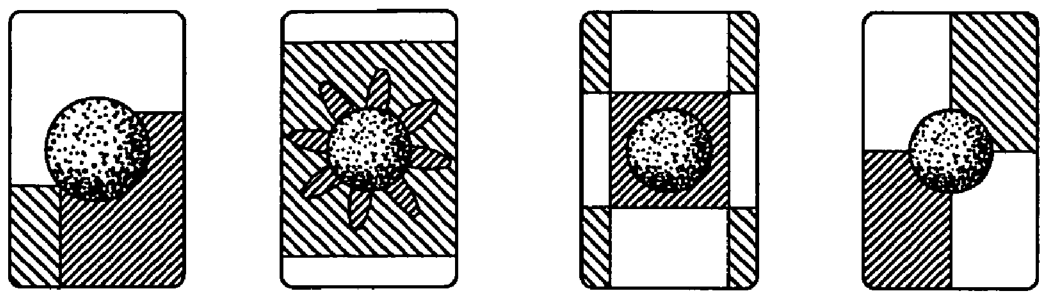
FIG. 7 is a front view showing various alternate embodiments of the electronic textile touch light controller.
Figure 7:
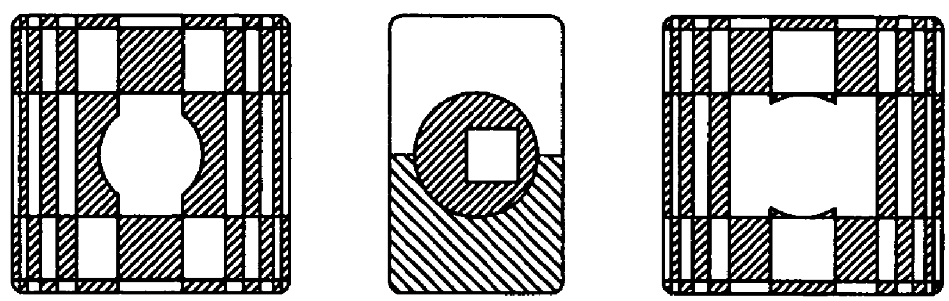
Figure 7:
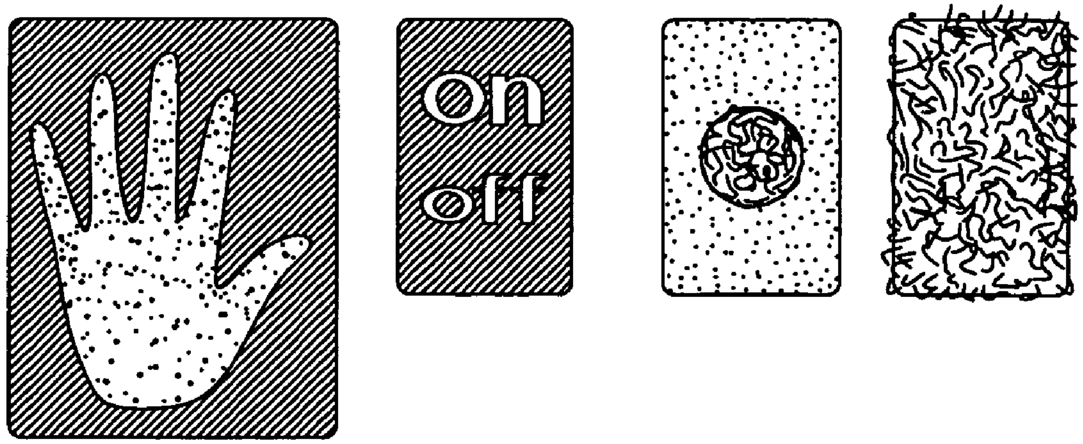

The several embodiments shown in FIG. 7 simply illustrate various alternate modes of practicing the invention, such as pompoms, fur, tufting, braid, tassels, beads, embroidery, fabric, printed ink, sewn designs, felting, gluing, or knitted designs.

What is claimed is:

1. An electronic textile touch light controller, comprising: a conductive textile electrode; a capacitive load plate linked to said conductive textile electrode; and means for linking said conductive textile electrode to said capacitive load plate.

2. The electronic textile touch light controller of claim 1, wherein said conductive textile electrode comprises a conductive pompom.

3. The electronic textile touch light controller of claim 2, wherein the conductive pompom is made of composite stainless steel yarns, metal coated nylon, or other soft conductive yarns.

4. The electronic textile touch light controller of claim 1, wherein the conductive textile electrode comprises conductive braid, conductive fur, conductive tufting, conductive tassel, conductive bead, conductive embroidery, conductive fabric, or conductive printed ink.

5. The electronic textile touch light controller of claim 1, wherein said conductive textile electrode is integrated with a fabric cover wrapped around a cover plate, said cover plate being mounted adjacent said load plate.

6. The electronic textile touch light controller of claim 5 wherein the means for linking said fabric cover to said capacitive load plate comprises a conductive element mounted between said fabric cover and said capacitive load plate.

7. The electronic textile touch light controller of claim 1 wherein the means for linking said conductive textile electrode to said capacitive load plate comprises a contact element having a first end and a second end, said first end being attached to said conductive textile electrode and said second end being attached to a conductive element mounted adjacent to said capacitive load plate.

8. The electronic textile touch light controller of claim 7 wherein the contact element comprises conductive yarn, said yarn having a first end and a second end.

9. The electronic textile touch light controller of claim 7 wherein the conductive element comprises double-sided conductive tape, said tape having a first side and a second side, said first side attaching to said second end of said contact element, and said second side attaching to said capacitive load plate.

10. The electronic textile touch light controller of claim 1 wherein said conductive textile electrode comprises a conductive pompom, the means for linking said conductive textile electrode to said capacitive load plate comprises a contact element having a first end and a second end, said first end being attached to said conductive pompom and said second end being attached to a conductive element mounted adjacent to said capacitive load plate, said contact element comprising a conductive yarn, and said conductive element comprises double-sided conductive tape, said tape having a first side and a second side, said first side attaching to said second end of said conductive yarn, and said second side attaching to said capacitive load plate.

11. The electronic textile touch light controller of claim 1, wherein said conductive textile electrode is positioned adjacent a lamp and said capacitive load plate is housed within said lamp.

12. A conductive textile element, such as a conductive pompom, for controlling electronic devices, comprising:

a generally spherical ball including multiple conductive yarns tied together with a conductive attachment; and means for electrically connecting the ball to a sensing circuit of an electrical device.

13. The conductive textile element of claim 12 wherein said conductive yarns comprise stainless steel fibers, stainless steel composites, coated nylon fibers, coated fiberglass, or other conductive yarns.

14. The conductive textile element of claim 12 wherein said ball is coated with conductive material after assembly.

15. The conductive textile element of claim 12 wherein said conductive attachment comprises wire.

16. The conductive textile element of claim 12 wherein said means for electrically connecting said ball to said sensing circuit comprises conductive yarn, conductive wire, conductive adhesive, conductive tape, or other conductive fastener.

17. The conductive textile element of claim 12 wherein said electrical device comprises a lamp, light switch, dimmer switch, toy, or other consumer electronic product.

18. An electronic textile lighting controller comprising: a conductive textile electrode linked to a sensing circuit, and linking means therefore, said linking means including a contact element having a first end and a second end, said first end being attached to the conductive textile electrode and said second end being attached to an element of the sensing circuit.

19. The electronic textile lighting controller of claim 18, wherein said conductive textile electrode comprises a conductive textile element, said contact element comprises a conductive yarn, and said element of the sensing circuit comprises a pin.

20. The electronic textile lighting controller of claim 18 wherein said conductive textile electrode is positioned adjacent a lamp and said sensing circuit is housed within said lamp.

* * * * *